United States Patent
Lee et al.

(10) Patent No.: US 8,188,475 B2
(45) Date of Patent: May 29, 2012

(54) TOP EMISSION TYPE ORGANIC ELECTROLUMINESCENT DEVICE AND METHOD OF FABRICATING THE SAME

(75) Inventors: Sang-Keun Lee, Gyeonggi-do (KR); Ho-Jin Kim, Gyeonggi-do (KR); Joon-Young Heo, Gyeonggi-do (KR); Joong-Hwan Yang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 313 days.

(21) Appl. No.: 12/581,376

(22) Filed: Oct. 19, 2009

(65) Prior Publication Data
US 2010/0096655 A1    Apr. 22, 2010

(30) Foreign Application Priority Data

Oct. 23, 2008   (KR) ........................ 10-2008-0104169

(51) Int. Cl.
*H01L 51/50* (2006.01)
*H01L 51/56* (2006.01)
(52) U.S. Cl. .................... 257/59; 257/98; 257/E51.018; 438/29; 438/458
(58) Field of Classification Search .................... 257/59, 257/98, E51.018; 438/29, 455, 458
See application file for complete search history.

(56) References Cited

U.S. PATENT DOCUMENTS

| 7,238,548 B2* | 7/2007 | Kurita et al. .................. 438/110 |
| 2004/0069986 A1* | 4/2004 | Park et al. ........................ 257/40 |
| 2005/0194589 A1* | 9/2005 | Park et al. ........................ 257/40 |
| 2008/0001864 A1 | 1/2008 | Lee et al. |
| 2008/0018245 A1 | 1/2008 | Kim et al. |

FOREIGN PATENT DOCUMENTS

| CN | 1983622 A | 6/2007 |
| JP | 2002-244589 | 8/2002 |
| KR | 10-2006-0088283 | 8/2006 |
| KR | 10-0709230 | 4/2007 |
| WO | 2006/080839 A2 | 8/2006 |

* cited by examiner

*Primary Examiner* — Tuan N. Quach
(74) *Attorney, Agent, or Firm* — Morgan, Lewis & Bockius LLP

(57) ABSTRACT

An organic electroluminescent device includes a first substrate including a plurality of pixel regions; a thin film transistor on the first substrate and in each pixel region; a second substrate facing the first substrate; an organic electroluminescent diode on the second substrate and connected to the thin film transistor; a seal pattern at edges of the first and second substrates; and an adhesive layer including a plurality of conductive balls, an inner space defined by the first substrate, the second substrate and the seal pattern filled with the adhesive layer.

14 Claims, 9 Drawing Sheets

TOP EMISSION TYPE ORGANIC ELECTROLUMINESCENT DEVICE AND METHOD OF FABRICATING THE SAME

The present application claims the benefit of Korean Patent Application No. 10-2008-0104169 filed in Korea on Oct. 23, 2008, which is hereby incorporated by reference.

BACKGROUND OF THE INVENTION

1. Field of the Invention

The present invention relates to an organic electroluminescent device (OELD) and more particularly to a top emission type OELD device and a method of fabricating the same.

2. Discussion of the Related Art

A cathode ray tube (CRT) has been widely used as a display device. Recently, however, a flat panel display device, for example, a plasma display panel (PDP) device, a liquid crystal display (LCD) device and an OELD, is used as a display device instead of the CRT.

Among these flat panel display devices, the OELD has an advantage in thickness and weight because the OELD does not require a backlight unit. The OELD device is a self-emission type display device. In addition, with comparison to the LCD device, the OELD has excellent capabilities of a wide viewing angle, contrast ratio, low power consumption, past response time, and so on. Moreover, since a fabricating method for the OELD is simple, there is another advantage in production costs.

The OELD is classified into a passive matrix type and an active matrix type. In the active matrix type OELD, a thin film transistor (TFT) as a switching element is disposed at each pixel. Since the active matrix type OELD device has excellent capabilities of high resolution, low power consumption and lifetime with comparison to the passive matrix type OELD, the active matrix type OELD is much widely introduced.

FIG. 1 is a schematic cross-sectional view of the related art OELD. In FIG. 1, the OELD 10 includes a first substrate 1, a second substrate 2 and a seal pattern 20. The second substrate 2 faces the first substrate 1. The seal pattern 20 is disposed at edges of the first and second substrates 1 and 2 to seal a space between the first and second substrates 1 and 2.

On the first substrate 1, a driving TFT DTr is formed. In addition, an organic electroluminescent diode E is formed over the first substrate 1 to be electrically connected to the driving TFT DTr. The organic electroluminescent diode E includes a first electrode 3, which is connected to the driving TFT DTr, an organic emission layer 5, which is disposed on the first electrode 3, and a second electrode 7, which is disposed on the organic emission layer 5. The organic emission layer 5 includes first to third organic emission patterns 5a to 5c for respectively emitting red (R), green (G) and blue (B) colors. The first electrode 3 serves as an anode, and the second electrode 7 serves as a cathode.

On the second substrate 2, an absorbent pattern 13 for absorbing moisture is formed.

The OELD 10 is classified into a top emission type and a bottom emission type depending on a transporting direction of light from the organic emitting layer 5. The bottom emission type OELD, where light passes through the first substrate 1, has advantages in stability and freedom of fabricating process, while the top emission type OELD, where light passes through the second substrate 2, has advantages in aperture ratio and resolution. Considering theses facts, the top emission type OELD is widely researched and introduced. Unfortunately, the second electrode 7 as a cathode is disposed on the organic emitting layer 5, so that there is a limitation in a material for the second electrode 7. As a result, light transmittance through the second electrode 7 is limited such that an optical efficiency is decreased.

In addition, since both the driving TFT DTr and the organic electroluminescent diode E are formed on the first substrate 1, production yield is reduced. Namely, if there is a defective during the driving TFT fabricating process or the organic electroluminescent diode fabricating process, an undesired OELD 10 are produced.

To resolve these problems, a dual panel type OELD is introduced. In the dual panel type OELD, an array element, for example, the driving TFT, is formed on one substrate, while the organic electroluminescent diode is formed on the other substrate. Then, the driving TFT and the organic electroluminescent diode are electrically connected to each other using a contact spacer.

On the other hand, the seal pattern for sealing an inner space of the OELD is formed of polymer. When the OELD is heated or used for long times, contaminants, for example, moisture or gas, are penetrated into an inner space of the OELD through the seal pattern such that properties of the organic electroluminescent diode are degraded. Particularly, an emission property of the organic emitting layer is degraded, and a lifetime of the organic electroluminescent diode is reduced. In addition, a dark point appears on a display screen because of the contaminants. When an external force is applied on the OELD, there is a crack on the first and second electrodes of the organic electroluminescent diode or the driving TFT. As a result, an image is not displayed by a pixel, where the crack is generated, such that there are problems of brightness or a displaying image quality.

SUMMARY OF THE INVENTION

Accordingly, the present invention is directed to a top emission type OELD and a method of fabricating the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent device includes a first substrate including a plurality of pixel regions; a thin film transistor on the first substrate and in each pixel region; a second substrate facing the first substrate; an organic electroluminescent diode on the second substrate and connected to the thin film transistor; a seal pattern at edges of the first and second substrates; and an adhesive layer including a plurality of conductive balls, an inner space defined by the first substrate, the second substrate and the seal pattern filled with the adhesive layer.

In another aspect, a method of fabricating an organic electroluminescent diode includes forming a thin film transistor on a first substrate including a plurality of pixel regions, the thin film transistor disposed in each pixel region; forming an electroluminescent diode on a second substrate facing the first substrate; forming a seal pattern one of the first and second substrates; forming an adhesive layer including a plurality of conductive balls on the one of the first and second substrates; and attaching the first and second substrates such that the thin film transistor connected to the organic electroluminescent diode, wherein an inner space defined by the first substrate, the second substrate and the seal pattern is filled with the adhesive layer.

In another aspect, an organic electroluminescent device includes a first substrate including a plurality of pixel regions; a thin film transistor on the first substrate and in each pixel region; an organic electroluminescent diode on the first electrode substrate and connected to the thin film transistor, the organic electroluminescent diode emitting a white light; a second substrate facing the first substrate; a color filter layer including red, green and blue color filter patterns on the second substrate; a seal pattern at edges of the first and second substrates; and an adhesive layer including a plurality of conductive balls, an inner space defined by the first substrate, the second substrate and the seal pattern filled with the adhesive layer.

In another aspect, a method of fabricating an organic electroluminescent diode includes forming a thin film transistor on a first substrate including a plurality of pixel regions, the thin film transistor disposed in each pixel region; forming an electroluminescent diode on the first substrate and connected to the thin film transistor, the organic electroluminescent diode emitting a white light; forming a color filter layer including red, green and blue color filter patterns; forming a seal pattern one of the first and second substrates on the second substrate; forming an adhesive layer including a plurality of conductive balls on the one of the first and second substrates; and attaching the first and second substrates such that the thin film transistor connected to the organic electroluminescent diode, wherein an inner space defined by the first substrate, the second substrate and the seal pattern is filled with the adhesive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
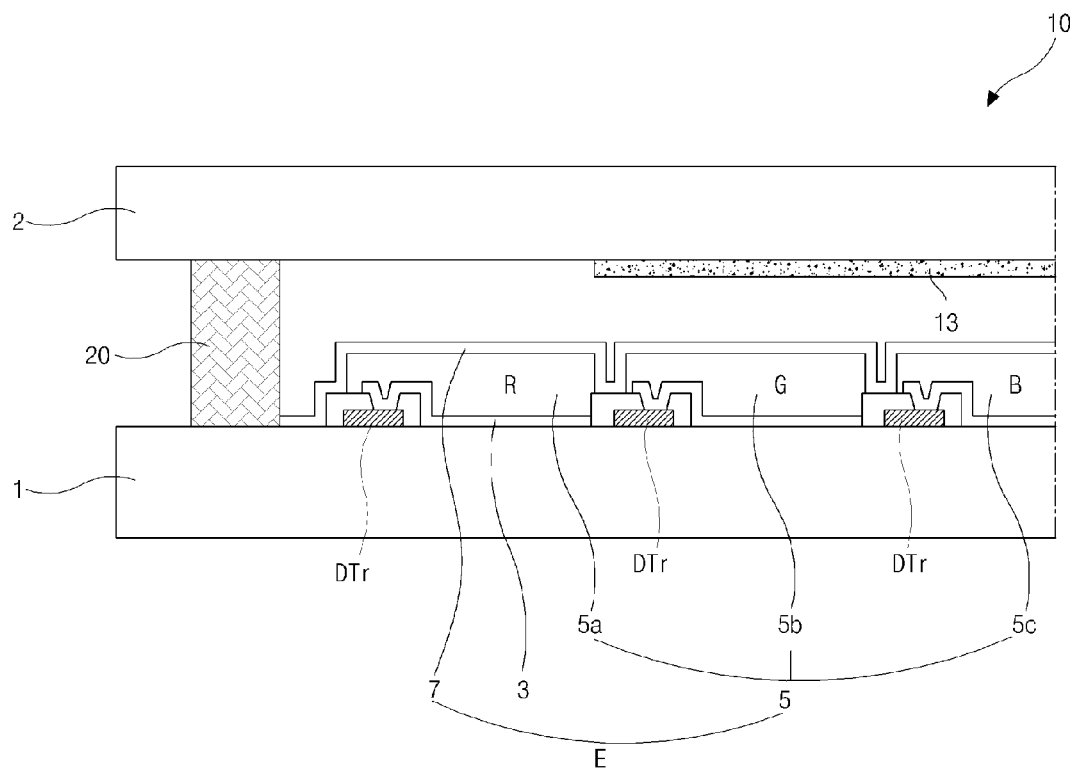
FIG. 1 is a schematic cross-sectional view of the related art OELD.
Figure 2:
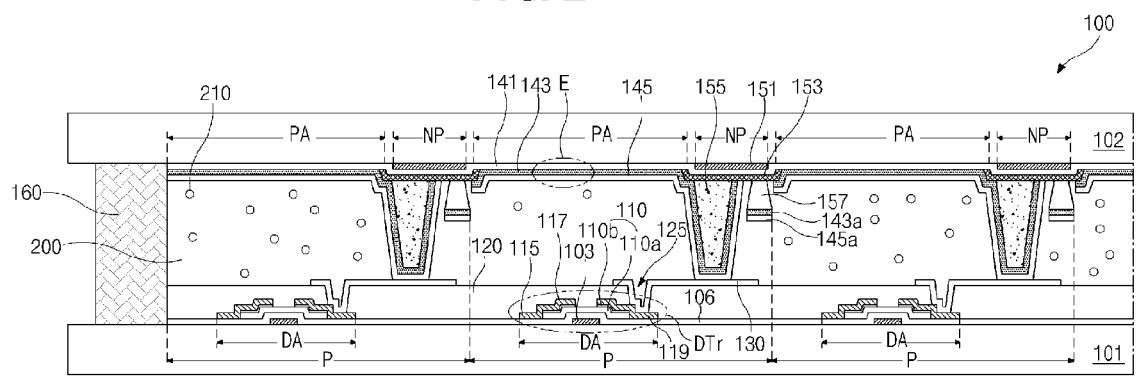
FIG. 2 is a schematic cross-sectional view of a top emission type OELD according to the present invention.

FIG. 2 is a schematic cross-sectional view of a top emission type OELD according to the present invention. For convenience of explanation, a driving region DA, where a driving TFT DTr is formed, a connection region NP, where a connection pattern 155 is formed, and an emission region PA, where an organic electroluminescent diode E is formed, are defined in each pixel region P. Although not shown, a switching region, where a switching TFT is formed, is also defined in each pixel region P.

In FIG. 2, a top emission type OELD 100 includes a first substrate 101, where the driving TFT DTr and the switching TFT (not shown) are formed, a second substrate 102, where the organic electroluminescent diode E is formed, and a seal pattern 160 at edges of the first and second substrates 101 and 102. A space between the first and second substrates 101 and 102 is sealed by the seal pattern 160.

On the first substrate 101, a gate line (not shown) and a data line 115 are formed. The gate line and the data line 115 cross each other such that the pixel region P is defined. The switching TFT is formed at a crossing portion of the gate line and the data line 115, and the driving TFT DTr is electrically connected to the switching TFT. As mentioned above, the switching TFT is disposed in the switching region, and the driving TFT DTr is disposed in the driving region DA. The driving TFT DTr includes a gate electrode 103, a gate insulating layer 106, a semiconductor layer 110, a source electrode 117 and a drain electrode 119. The switching TFT also has substantially the same structure as the driving TFT DTr. The semiconductor layer 110 includes an active layer 110a of intrinsic amorphous silicon and an ohmic contact layer 110b of impurity-doped amorphous silicon.

A passivation layer 120 including a drain contact hole 125 is formed on the switching TFT and the driving TFT DTr. The drain contact hole 125 exposes the drain electrode 119 of the driving TFT DTr. A connection electrode 130 is formed on the passivation layer 120 and in each pixel region P. The connection electrode 130 contacts the drain electrode 119 of the driving TFT DTr through the drain contact hole 125. Although not shown, a power line for applying a voltage into the organic electroluminescent diode E through the driving TFT DTr is formed on the first substrate 101. The first substrate 101, where the driving TFT DTr, the switching TFT and the connection electrode 130 are formed, may be called as an array substrate.

On the second substrate 102, an auxiliary electrode 151 is formed in the connection region NP. A first electrode 141 is formed on an entire surface of the second substrate 102 where the auxiliary electrode 151 is formed. The first electrode 141 is formed of a first metallic material having a relatively high work function. For example, the first electrode 141 is formed of a transparent conductive material, such as indium-tin-oxide (ITO) and indium-zinc-oxide (IZO). A buffer pattern 153 is formed on the first electrode 153 and in the connection region NP. A connection pattern 155 is formed on the buffer pattern 153 and in the connection region NP. The connection pattern 155 has a function of a column for connecting the organic electroluminescent diode E to the driving TFT DTr. In addition, a partition 157 is formed on the buffer pattern 153 and in the connection region NP. The partition 157 surrounds a boundary of each pixel region P.

An organic emitting layer 143 and a second electrode 145 are stacked on the first electrode in the emission region PA and the connection pattern 155 in the connection region NP. The organic emitting layer 143 has an island shape in each pixel region P due to the partition 157. Namely, the organic emitting layer 143 in one pixel region P is isolated from the organic emitting layer 143 in another pixel region P. The second electrode 145 also has an island shape in each pixel region P similarly to the organic emitting layer 143. The organic emitting layer 143 may be formed of an organic emitting material for emitting red, green and blue colors. The second electrode 145 is formed of a second metallic material having a relatively low work function. A work function of a material of the second electrode 145 is smaller than that of the first electrode 141. The second electrode 145 may be formed of an opaque material. The first and second electrode 141 and 145 and the organic emitting layer 143 constitute the organic electroluminescent diode E. Since the first electrode 141 is formed of a transparent material and the second electrode 145 is formed of an opaque material, light from the organic emitting layer 143 passes through the first electrode 141. It may be called as a top emission type. The second substrate 102, where the organic electroluminescent diode E is formed, may be called as an organic electroluminescent diode substrate.

The first electrode 141 has a single plate shape on an entire surface of the second substrate 102 such that a current drop is generated with respect to a position. The current drop problem causes an uniformity of brightness or an image property to be decreased such that power consumption is increased. However, the current drop problem is prevented due to the auxiliary electrode 151 electrically connected to the first electrode 141. Namely, an electrical resistance of the first electrode 141 is reduced due to the auxiliary electrode 151. For example, a material of the auxiliary electrode 151 has an electrical resistance smaller than that of the first electrode 141.

As mentioned above, each of the organic emitting layer 143 and the second electrode 145 has an island shape in each pixel region P due to the partition 157. FIG. 2 shows the organic emitting layer 143 of a single layer formed of an organic emitting material. Alternatively, the organic emitting layer 143 may have multiple layers. For example, the organic emitting layer 143 includes a hole injection layer, a hole transporting layer, an emitting material layer, an electron transporting layer and an electron injection layer. The second electrode 145 may be formed of aluminum (Al) and Al alloy (AlNd). The second electrode 145 corresponding to the connection pattern 155 electrically contacts the connection electrode 130 on the first substrate 101 such that the organic electroluminescent diode E is electrically connected to the driving TFT DTr. Namely, the connection pattern 155 has a function of both a connection element between the organic electroluminescent diode E and the driving TFT DTr and a column spacer for maintaining a cell gap between the first and second substrates 101 and 102.

In more detail, the connection electrode 130, which is connected to the drain electrode 119 of the driving TFT DTr on the first substrate 101, contacts the second electrode 145 covering the connection pattern 155 on the second substrate 102 such that the organic electroluminescent diode E on the second substrate 102 is electrically connected to the driving TFT DTr on the first substrate 101.

The array substrate including the switching TFT, the driving TFT DTr and the connection electrode 130 and the organic electroluminescent diode including the organic electroluminescent diode E are separately fabricated and attached to obtain the OELD 100.

When voltages are applied to the first and second electrodes 141 and 145, the OELD 100 emits light by injecting electrons from a cathode and holes from an anode into an emission layer, combining the electrons with the holes, generating an exciton, and transforming the exciton from an excited state to a ground state. The light from the organic electroluminescent diode E passes through the first electrode 141 of a transparent material such that the OELD 100 can display images.

An adhesive layer 200 including a plurality of conductive balls 210 is formed between an inner space between the first and second substrates 101 and 102. Namely, the inner space defined by the first and second substrates 101 and 102 and the seal pattern 160 is filled with the adhesive layer 200. The penetration of contaminants, for example, moisture or gases, into the inner space between the first and second substrates 101 and 102 is prevented due to the adhesive layer 200. In addition, an electrical disconnection between the driving TFT DTr and the organic electroluminescent diode E is prevented due to the adhesive layer 200.

The edges of the first and second substrates 101 and 102 are sealed by the seal pattern 160. However, since the seal pattern 160 is formed of polymer, moisture or gas is penetrated into the inner space between the first and second substrates 101 and 102 through the seal pattern 160 when the OELD is heated or used for long times. As mentioned above, the contaminants cause properties of the organic electroluminescent diode to be degraded or lifetime of the organic electroluminescent diode to be reduced. In addition, when an external force is applied on the OELD, there is a crack on the first and second electrodes of the organic electroluminescent diode or the driving TFT. Moreover, the gases cause an internal pressure to be increased such that the first and second substrates push each other. As a result, the driving TFT DTr on the first substrate and the organic electroluminescent diode on the second substrate are electrically disconnected.

In the present invention, an inner space between the first and second substrates 101 and 102 is filled with the adhesive layer 200 such that the contaminants are blocked. Accordingly, the problems, for example, a degradation of properties of the organic electroluminescent diode, are prevented. In addition, even if an external force is applied on the OELD, there is no damage on the organic electroluminescent diode or the driving TFT due to the adhesive layer 200. Furthermore, since the adhesive layer 200 includes the plurality of conductive balls 210, an electrical connection between the driving TFT DTr on the first substrate and the organic electroluminescent diode on the second substrate is obtained. Namely, even if the adhesive layer 200 is disposed between the connection electrode 130 and the second electrode 145, the connection electrode 130 is electrically connected to the second electrode 145 through the conductive balls 210. Alternatively, the connection electrode 130 directly contacts the second electrode 145 without the adhesive layer 200 therebetween.

Figure 3:
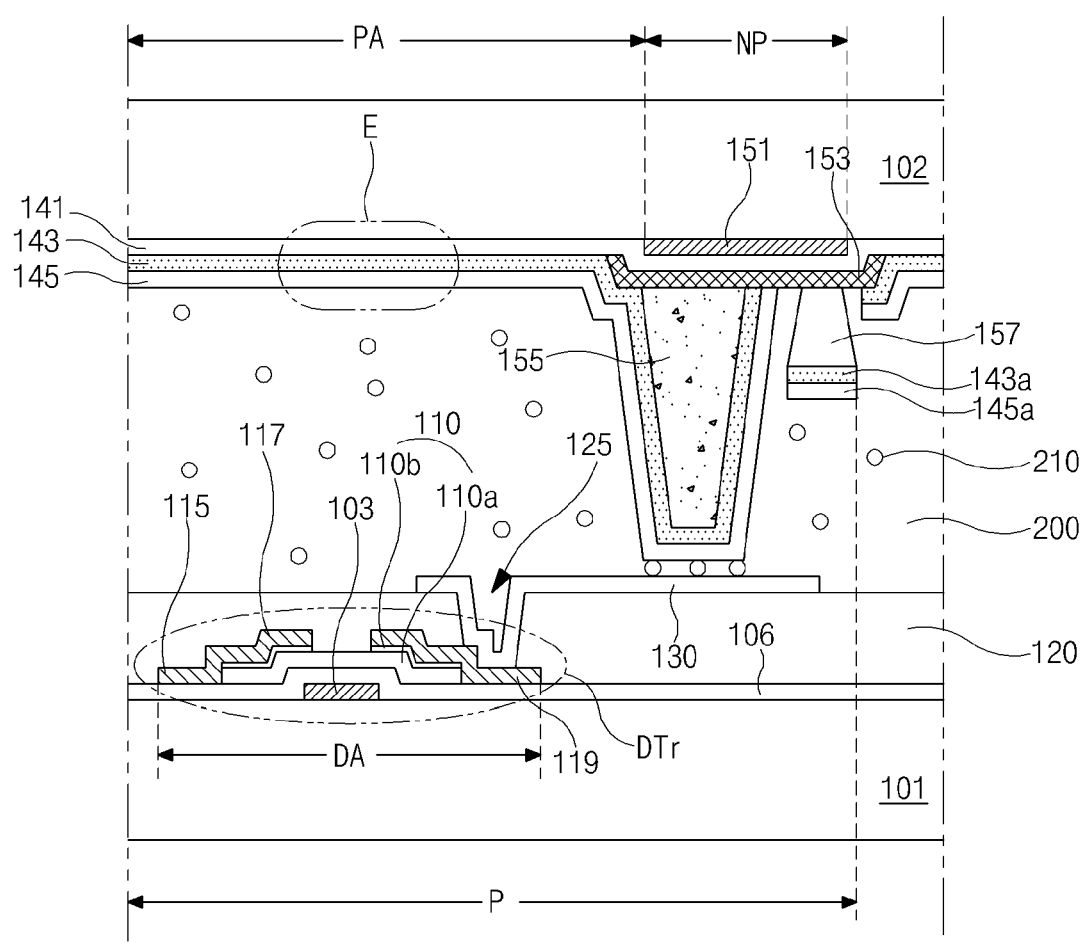
FIG. 3 is a schematic cross-sectional view illustrating an electrical connection between an organic electroluminescent diode and a driving TFT in a top emission type OELD according to the present invention.

FIG. 3 is a schematic cross-sectional view illustrating an electrical connection between an organic electroluminescent diode and a driving TFT in a top emission type OELD according to the present invention. As shown in FIG. 3, on the first substrate 101, the driving TFT DTr including the gate electrode 103, the gate insulating layer 106, the semiconductor layer 110, the source electrode 117 and the drain electrode 119 is formed in the driving region DA. The passivation layer 120 including the drain contact hole for exposing the drain electrode 119 is formed on the driving TFT DTr. In addition, the connection electrode 130 contacting the drain electrode 119 of the driving TFT DTr through the drain contact hole 125 is formed in each pixel region P and on the passivation layer 120.

On the second substrate 102 facing the first substrate 101, the auxiliary electrode 151 is formed in the connection region NP. The first electrode 141 is formed on an entire surface of the second substrate 102 where the auxiliary electrode 151 is formed. The buffer pattern 153 and the connection pattern 155 are stacked on the first electrode 141 and in the connection region NP. The connection pattern 155 may have substantially the same thickness as a cell gap between the first and second substrates 101 and 102. The partition 157 is formed on the buffer pattern 153 and in the connection region NP. The partition 157 surrounds a boundary of each pixel region P.

The organic emitting layer 143 and a second electrode 145 are stacked on the first electrode in the emission region PA and the connection pattern 155 in the connection region NP. The first electrode 141, the organic emitting layer 143 and the second electrode 145 constitute the organic electroluminescent diode E. The second electrode 145 does not contact the first electrode 141 due to the buffer pattern 153.

As mentioned above, each of the organic emitting layer 143 and the second electrode 145 has an island shape in each pixel region P due to the partition 157 without an additional mask process. During a fabricating process of the organic emitting layer 143 and the second electrode 145, an organic emitting material pattern 143a and a metal pattern 145a are stacked on the partition 157.

The connection pattern 155 has a reverse-trapezoid shape with respect to the first substrate 101 (a trapezoid shape with respect to the second substrate 102). Namely, a first portion of the connection pattern 155 has a first width smaller than a second width of a second portion, which is closer to the second substrate than the first portion, of the connection pattern 155. A cell gap between the first and second substrates 101 and 102 is maintained by the connection pattern 155.

The first and second substrates 101 and 102 are attached to each other using the adhesive layer 200 including the plurality of conductive balls 210. An inner space between the first and second substrates 101 and 102 is filled with the adhesive layer 200 such that the penetration of contaminants, for example, moisture or gases, into the inner space between the first and second substrates 101 and 102 is prevented. The conductive balls 210 are spread in an adhesive resin of the adhesive layer 200. The conductive ball 210 is a conductive sphere body covered with a thin insulating film. When an external force is applied to the conductive ball 210, the thin insulating film is broken such that the conductive ball 210 has a conductive property.

When the connection electrode 130 and the second electrode 145 are closet to each other, the conductive balls 210 in the adhesive layer 200 is positioned therebetween such that the connection electrode 130 is electrically connected to the second electrode 145 through the conductive balls 210. The conductive balls 210 are pressed by the connection electrode 130 and the second electrode 145 such that the thin insulating film, which covers the conductive sphere body of the conductive balls 210, is broken. Accordingly, the connection electrode 130 can be electrically connected to the second electrode 145. If the adhesive layer does not include the conductive balls, there may be a problem in the contact of the second electrode and the connection electrode because of the adhesive layer. However, the above problem is not generated in the present invention due to the conductive balls in the adhesive layer 200.

The OELD 100 according to the present invention is fabricated by attaching the array substrate and the organic electroluminescent diode substrate and injecting the adhesive layer 210 into an inner space between the array substrate and the organic electroluminescent diode substrate. The array substrate and the organic electroluminescent diode substrate may be attached before injecting the adhesive layer 210 into an inner space between the array substrate and the organic electroluminescent diode substrate. This process will be explained with FIGS. 4A to 4D and 5A to 5G.

Figure 4A:
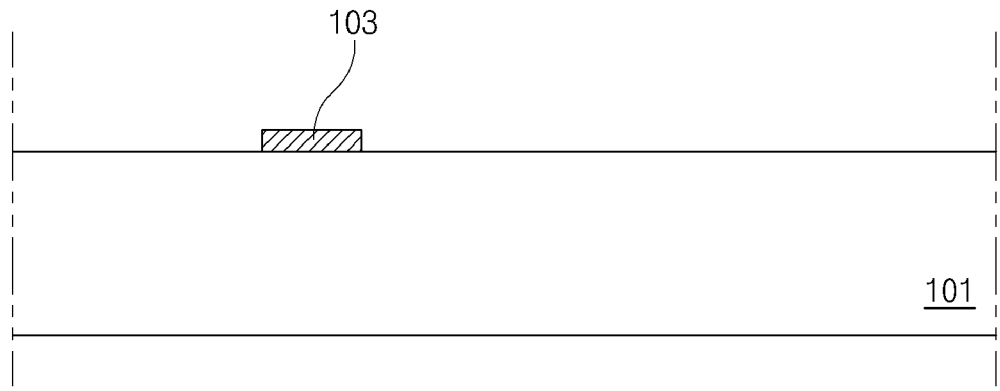
FIGS. 4A to 4D are cross-sectional views illustrating a fabricating process of an array substrate for a top emission type OELD according to the present invention.

FIGS. 4A to 4D are cross-sectional views illustrating a fabricating process of an array substrate for a top emission type OELD according to the present invention. FIG. 4A shows a fabricating process of the driving TFT. The switching TFT and the power line may be formed through the common process.

In FIG. 4A, a first metal layer (not shown) is formed on the first substrate 101. The first metal layer is patterned by a photolithography process to form the gate electrode 103 is formed on the first substrate 101. Although not shown, a gate line is formed on the first substrate 101. In addition, a gate electrode for the switching TFT is formed. The gate electrode for the switching TFT is connected to the gate line.

Figure 4B:
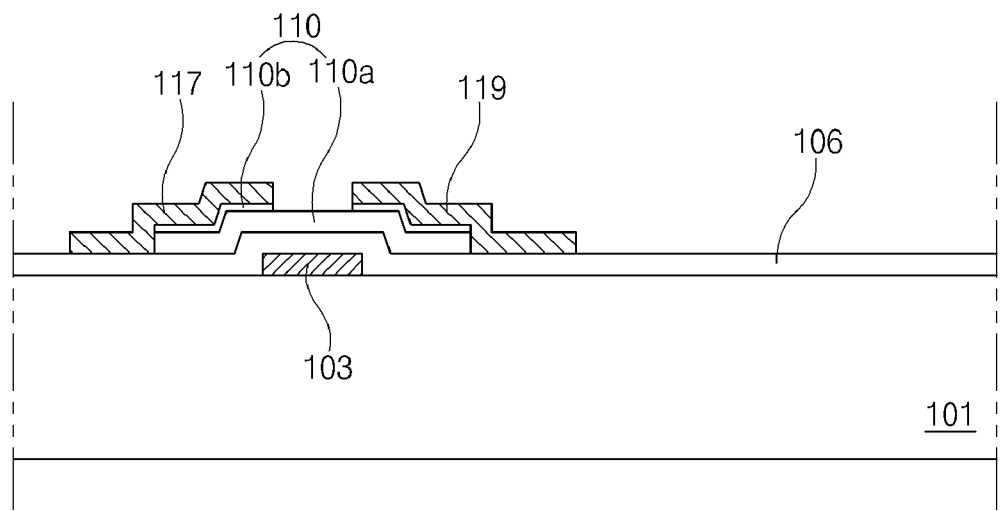

Next, in FIG. 4B, the gate insulating layer 106 is formed on the gate electrode 103. An intrinsic amorphous silicon layer (not shown) and an impurity-doped amorphous silicon layer (not shown) are sequentially formed on the gate insulating layer 106 and patterned by a photolithography process to form the active layer 110a and the ohmic contact layer 110b. The active layer 110a and the ohmic contact layer 110b constitute the semiconductor layer 110. Although not shown, a semiconductor layer for the switching TFT is also formed.

Next, a second metal layer (not shown) is deposited on the semiconductor layer 110 and patterned by a photolithography process to form the source electrode 117 and the drain electrode 119. Although not shown, a data line is formed on the gate insulating layer 106 from the second metal layer. In addition, the source and drain electrodes for the switching TFT are also formed. The source electrode of the switching TFT is connected to the data line, and the drain electrode of the switching TFT is connected to the gate electrode of the driving TFT. Although not shown, a power line is formed at the same time.

Figure 4C:
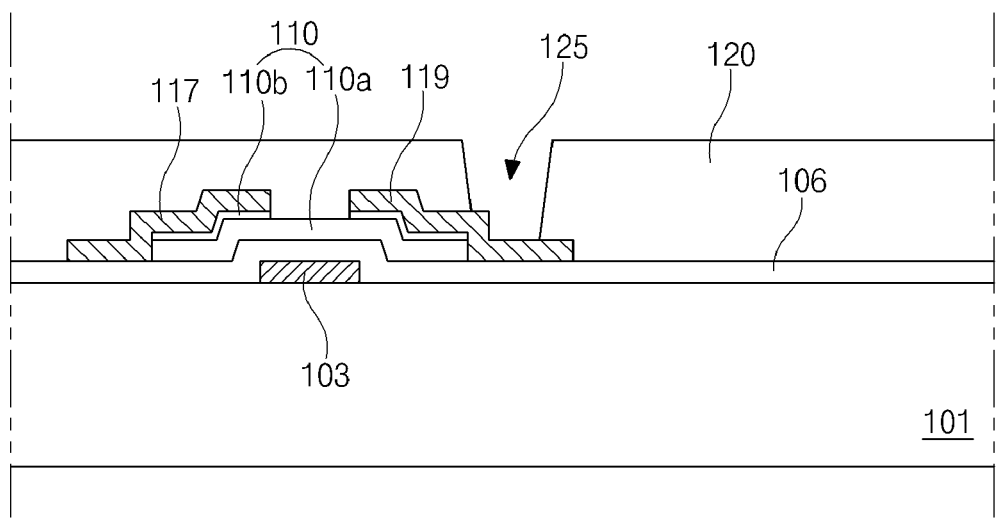

Next, in FIG. 4C, the passivation layer 120 is formed on the source and drain electrode 117 and 119 and patterned to form the drain contact hole 125 exposing the drain electrode 119 of the driving TFT.

Figure 4D:
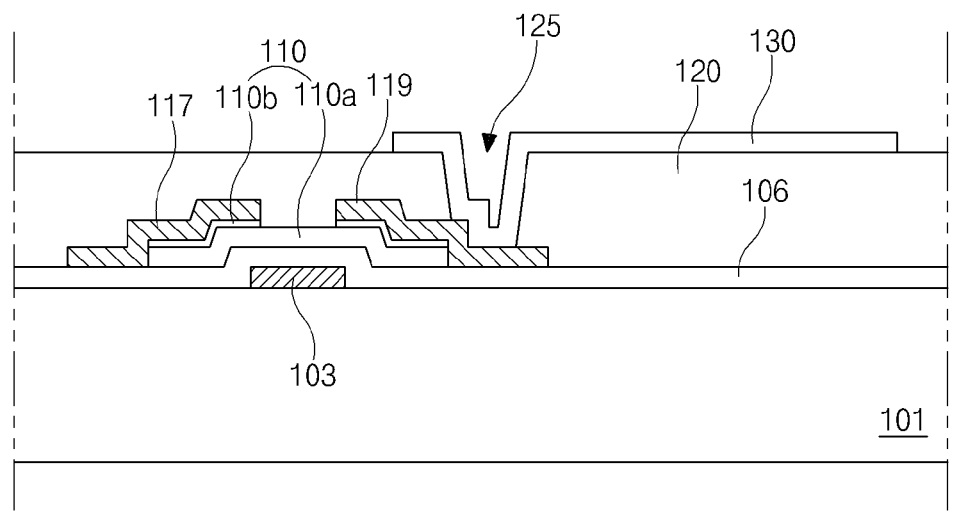

Next, in FIG. 4D, a third metal layer (not shown) is deposited on the passivation layer 120 and patterned to form the connection electrode 130. The connection electrode 130 is connected to the drain electrode 119 of the driving TFT through the drain contact hole.

FIGS. 5A to 5G are cross-sectional views illustrating a fabricating process of an organic electroluminescent diode substrate for a top emission type OELD according to the present invention.

Figure 5A:
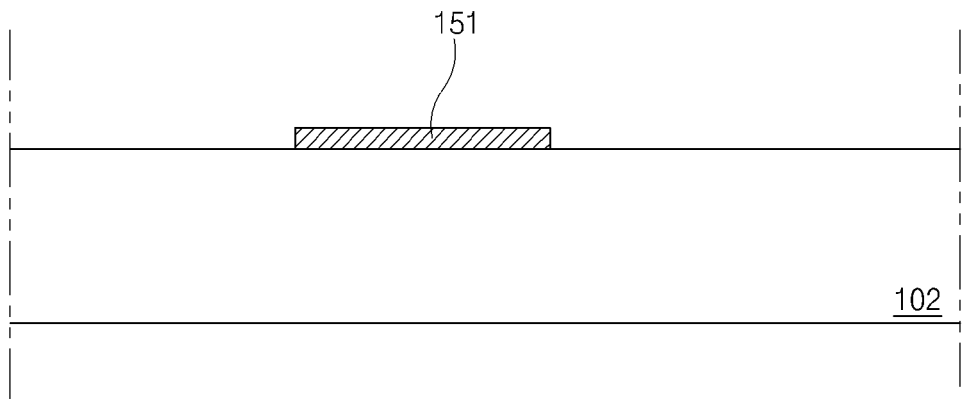
FIGS. 5A to 5G are cross-sectional views illustrating a fabricating process of an organic electroluminescent diode substrate for a top emission type OELD according to the present invention.

In FIG. 5A, a fourth metal layer (not shown) is formed on the second substrate 102 by depositing one of a metallic material including molybdenum (Mo), titanium (Ti), silver-indium-tin-oxide (Ag-ITO). The fourth metal layer is patterned to form the auxiliary electrode 151. The auxiliary electrode 151 is positioned in the connection region NP (of FIG. 2).

Figure 5B:
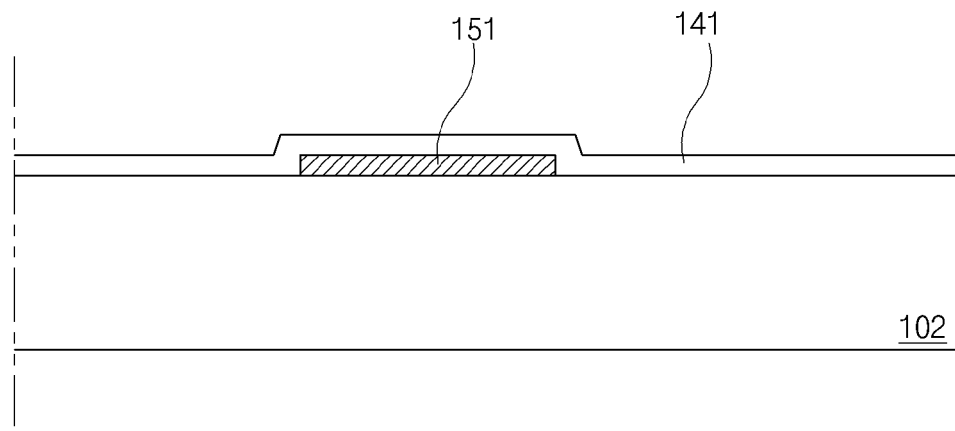

Next, in FIG. 5B, the first electrode 141 is formed on an entire surface of the second substrate including the auxiliary electrode 151. The first electrode 141 is formed of a transparent conductive material. When the first electrode 141 severs as an anode, the first electrode 141 is formed of a transparent conductive material having a relatively high work function. For example, the first electrode 141 may be formed of ITO or IZO.

Figure 5C:
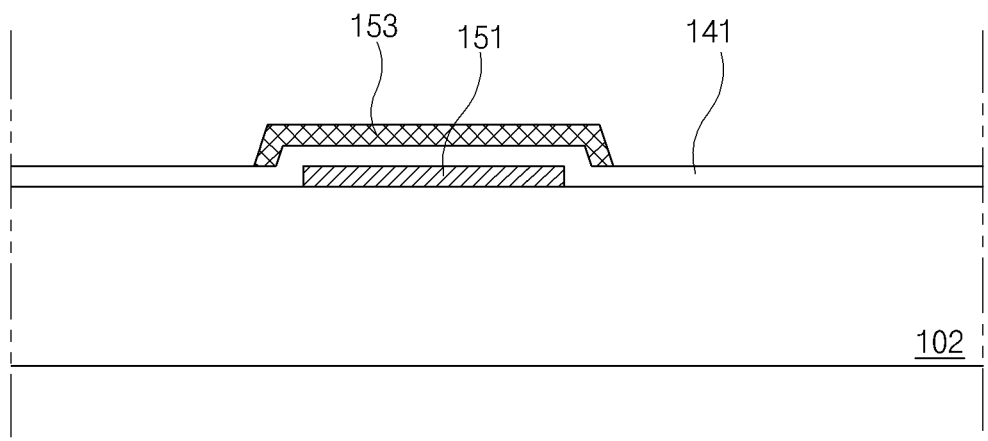

Next, in FIG. 5C, a first organic insulating material layer (not shown) is formed on the first electrode 141 by coating an inorganic insulating material including silicon oxide or silicon nitride. The first organic insulating material layer is patterned to form the buffer pattern 153. The buffer pattern 153 is positioned in the connection region NP to correspond to the auxiliary electrode 151.

Figure 5D:
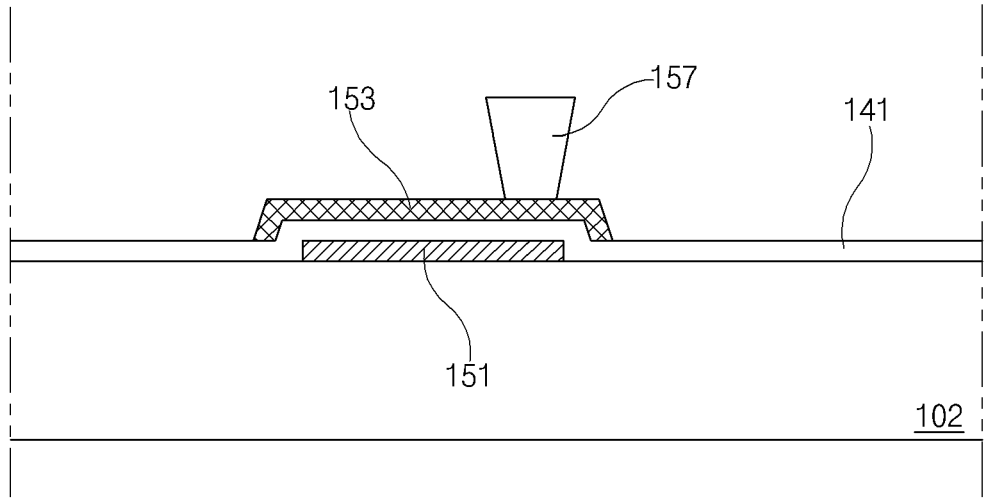

Next, in FIG. 5D, a second organic insulating material layer (not shown) is formed on the buffer pattern 153 by coating an organic insulating material of one of photo-acryl and benzocyclobutene (BCB). The second organic insulating material layer is patterned to form the partition 157 having a reverse-trapezoid shape with respect to the second substrate 102. The partition 157 is positioned on the buffer pattern 153 in the connection region NP. Namely, a first portion of the partition 157 has a first width larger than a second width of a second portion, which is closer to the second substrate than the first portion, of the partition 157.

Figure 5E:
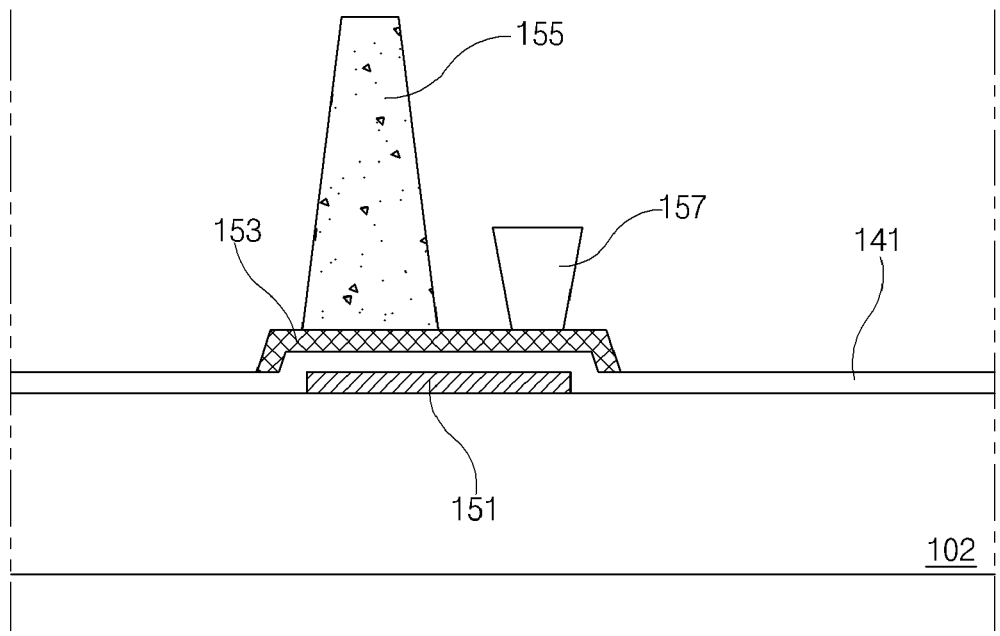
Figure 5F:
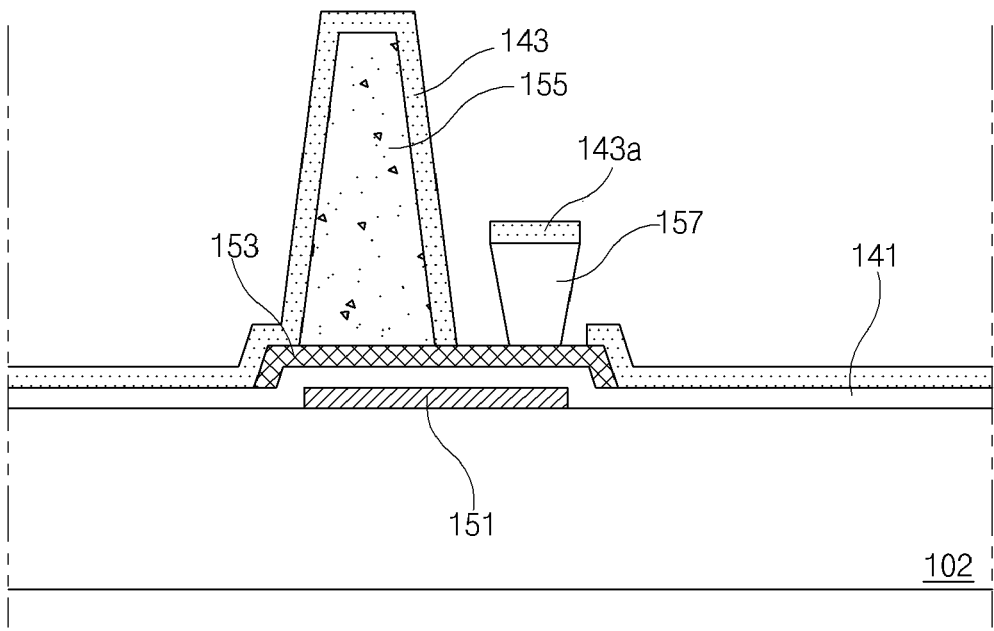
Figure 5G:
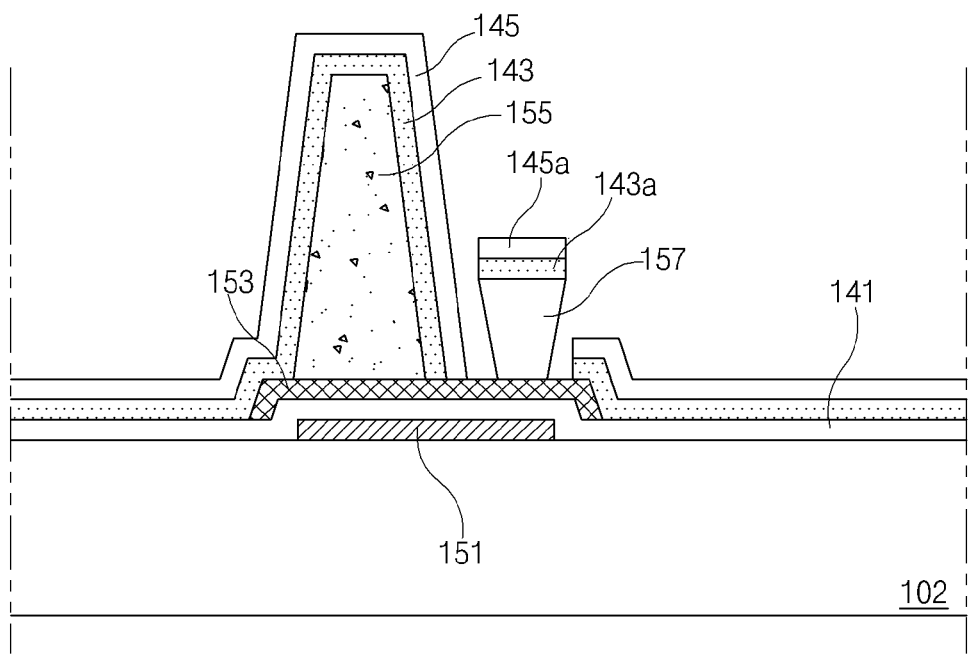

Next, in FIG. 5E, a third organic insulating material layer (not shown) is formed on the buffer pattern 153 by coating an organic insulating material of the other one of photo-acryl and benzocyclobutene (BCB). The third organic insulating material layer is patterned to form the connection pattern 155 having a trapezoid shape with respect to the second substrate 102. Namely, a first portion of the connection pattern 155 has a first width smaller than a second width of a second portion, which is closer to the second substrate than the first portion, of the connection pattern 155. The connection pattern 155 is also positioned on the buffer pattern 153 in the connection region NP and spaced apart from the partition 157. The connection pattern 155 has a reverse shape of the partition 157 and a height larger than the partition 157. A material of the partition 157 is a photosensitive of a negative type, while a material of the connection pattern 155 is a photosensitive of a positive type. Alternatively, a material of the partition 157 is a photosensitive of a positive type, while a material of the connection pattern 155 is a photosensitive of a negative type. In FIGS. 5F and 5G, the connection pattern 155 is formed after the partition 157 has been formed. Alternatively, the connection pattern 155 is formed before the partition 157 is formed.

Next, in FIG. 5F, the organic emitting layer 143 is formed on the first electrode 141, the connection pattern 155 and the partition 157 by coating or depositing an organic emitting material. Since the partition 157 has the reverse-trapezoid shape, the organic emitting layer 143 has an island shape in each pixel region P without an additional photolithography process (or a mask process). The organic emitting material is formed using one of a nozzle coating apparatus, a dispensing apparatus and an ink jet apparatus. Alternatively, the organic emitting material may be formed by a thermal depositing method using a shadow mask. The organic emitting material pattern 143a is positioned on the partition 157.

Next, in FIG. 5G, the second electrode 145 is formed on the organic emitting layer 143 by depositing a low work function metal group including one of Al and AlNd. Similar to the organic emitting layer 143, the second electrode 145 has an island shape in each pixel region P due to the partition 157 without an additional photolithography process.

Figure 6:
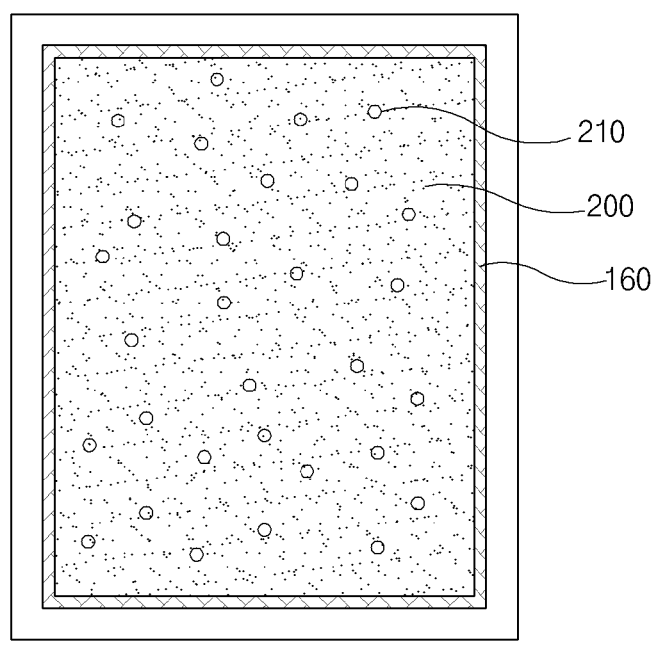
FIG. 6 is a schematic plan view illustrating an adhesive layer for a top emission type OELD according to the present invention.

Referring to FIG. 6, on edges of one of the array substrate in FIG. 4D and the organic electroluminescent diode substrate in FIG. 5G, the seal pattern 160 is formed. An inner space of the array substrate in FIG. 4D and the organic electroluminescent diode substrate in FIG. 5G is sealed by the seal pattern 160 after attaching the array substrate in FIG. 4D and the organic electroluminescent diode substrate in FIG. 5G. The seal pattern 160 may be formed of a thermosetting resin or a photopolymer which is cured when exposed in UV light. An absorbent (not shown) may be further formed inside the seal pattern 160 to block moisture such that a thermal degradation of the organic emitting layer 143 (of FIG. 5G) resulted from moisture can be further prevented.

On one of the array substrate in FIG. 4D and the organic electroluminescent diode substrate in FIG. 5G, where the seal pattern 160 is formed, the adhesive layer 200 including the conductive balls 210 is formed by an one drop filing (ODF) method or a dispensing method. The ODF method uses a principle of a syringe. Namely, an adhesive material in a storage tank (not shown) is drop on the substrate in a point dotting type when an external force is applied to the storage tank such that the adhesive layer 200 is formed. The dispensing method uses a similar principle.

Then, the array substrate and the organic electroluminescent diode substrate are attached, so that the connection electrode 130 on the array substrate and the second electrode 145 on the organic electroluminescent diode substrate contact each other. Even if the adhesive layer 200 is positioned between the connection electrode 130 and the second electrode 145, there is no problem in an electrical connection because of the conductive balls 210 in the adhesive layer 200.

As mentioned above, since an inner space between the array substrate and the organic electroluminescent diode is filled with the adhesive layer, they are closely adhered to each other. In addition, the penetration of contaminants, for example, moisture or gases, into the inner space between the first and second substrates 101 and 102 is prevented. Accordingly, a decrease of emitting properties in the organic emitting layer 143 is prevented. A lifetime of the OELD 100 is increased and an image quality is improved.

Moreover, even if an external force is applied to the OELD 100, there is no damage on the electrodes of the organic electroluminescent diode E or the driving TFT due to the adhesive layer 200.

Furthermore, an electrical connection between the connection electrode 130 on the array substrate and the second electrode 145 is successfully obtained due to the conductive balls 210 in the adhesive layer 200.

FIG. 2 to FIG. 5G show each of the switching TFT and the driving TFT DTr including the semiconductor layer 110 which includes the active layer 110a of intrinsic amorphous silicon and the ohmic contact layer 110b of impurity-doped amorphous silicon. Each of the switching TFT and the driving TFT DTr is a bottom gate type. Top gate type TFTs including a semiconductor layer of polycrystalline silicon will be explained below with FIG. 7.

Figure 7:
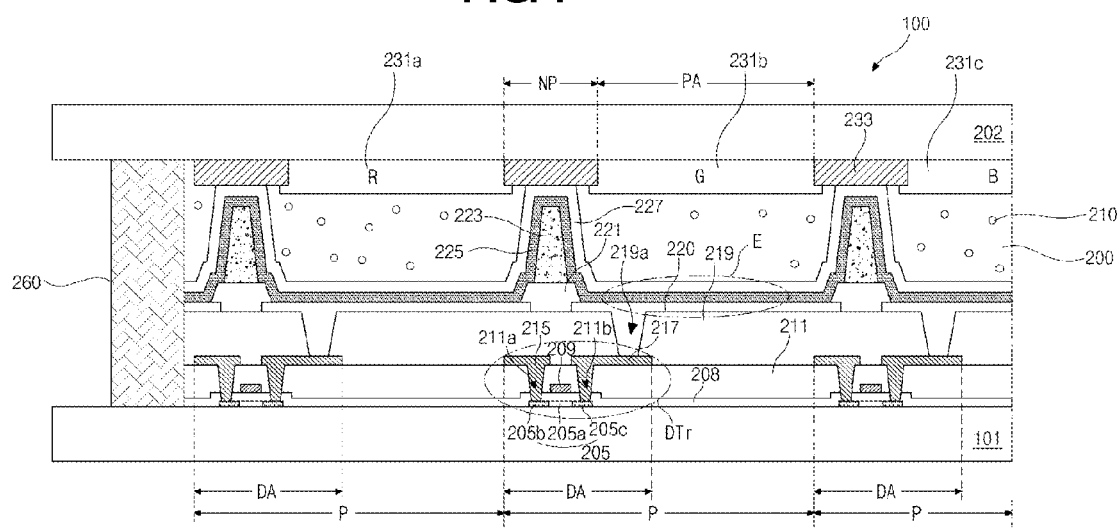
FIG. 7 is a schematic cross-sectional view of a top emission type OELD according to the present invention.

FIG. 7 is a schematic cross-sectional view of a top emission type OELD according to the present invention. The explanation is focused on the TFTs. For convenience of explanation, a driving region DA, where a driving TFT DTr is formed, a connection region NP, where a connection pattern 155 is formed, and an emission region PA, where an organic electroluminescent diode E is formed, are defined in each pixel region P. Although not shown, a switching region, where a switching TFT is formed, is also defined in each pixel region P.

In FIG. 7, an OELD 200 includes a first substrate 201, where the driving TFT DTr and the switching TFT (not shown) are formed, a second substrate 202, where the organic electroluminescent diode E is formed, and a seal pattern 260 at edges of the first and second substrates 201 and 202. An inner space between the first and second substrates 201 and 202 is sealed by the seal pattern 260.

On the first substrate 201, a semiconductor layer 205 of polycrystalline silicon is formed in the driving region DA. A center of the semiconductor layer 205 serves as an active region 205a of a channel. High concentration impurities are doped at both sides of the center of the semiconductor layer 205 such that the both sides serves as a source region 205b and a drain region 205c, respectively. A gate insulating layer 208 is formed on the semiconductor layer 205.

A gate electrode 209 corresponding to the active region 205a is formed on the gate insulating layer 208. Although not shown, a gate line is formed on the gate insulating layer 208. An interlayer insulating layer 211 is formed on the gate line and the gate electrode 209. The interlayer insulating layer 211 and the gate insulating layer 208 are patterned to form first and second contact holes 211a and 211b respectively exposing the source region 205b and the drain region 205c of the semiconductor layer 205.

On the interlayer insulating layer 211, source and drain electrodes 215 and 217 are formed to be respectively connected to the source region 205b and the drain region 205c of the semiconductor layer 205 through the first and second contact holes 211a and 211b. The source and drain electrodes 215 and 217 are spaced apart from each other. Although not shown, a data line is formed on the interlayer insulating layer 211 and cross the gate line to define the pixel region P.

The semiconductor layer 205, the gate insulating layer 205, the gate electrode 209, the interlayer insulating layer 211, the source electrode 215 and the drain electrode 217 constitute the driving TFT DTr. Although not shown, a switching TFT and a power line are further formed on the first substrate 201. The switching TFT may have substantially the same structure as the driving TFT. The switching TFT is electrically connected to the gate line, the data line and the driving TFT DTr. The driving TFT is electrically connected to the power line and the organic electroluminescent diode.

A passivation layer 219 is formed on the source and drain electrodes 215 and 217 of the driving TFT DTr and includes a drain contact hole 219a exposing the drain electrode 217 of the driving TFT DTr. On the passivation layer 219, a first electrode 220 is formed of a material having a relatively high work function in each pixel region P. The first electrode 220 is connected to the drain electrode 217 through the drain contact hole 219a. The first electrode 220 serves as an anode. The first electrode 220 may be opaque. A bank 221 is formed at boundaries of the pixel region P. Namely, the bank 221 is positioned between first electrodes 220 in adjacent pixel regions P. A column spacer 223 having a column shape is formed on the bank 221.

An organic emitting layer 225 is formed on an entire surface of the first substrate 201. Namely, the organic emitting layer 225 covers the first electrode 220 and the column spacer 223. FIG. 7 shows the organic emitting layer 225 of a single layer formed of an organic emitting material. Alternatively, the organic emitting layer 225 may have multiple layers. For example, the organic emitting layer 225 includes a hole injection layer, a hole transporting layer, an emitting material layer, an electron transporting layer and an electron injection layer. Unlike the organic emitting layer 143 in FIG. 2, the organic emitting layer 225 in FIG. 7 has a continuous layer through all pixel regions P and emits white light.

On the organic emitting layer 225, a second electrode 227 as a cathode is formed. FIG. 7 shows the second electrode 227 of a single layer. The second electrode 227 of a single layer is formed a metallic material having a relatively low work function. The material of the first layer has a work function smaller than that of the first electrode 220. The second electrode 227 of a single layer is a thin film to be substantially transparent. Alternatively, the second electrode 227 may have a double-layered structure. A first layer of the double-layered structure is formed of a metallic material having a relatively low work function. The material of the first layer has a work function smaller than that of the first electrode 220. The first layer is a thin film to be substantially transparent. The second layer, which is stacked on the first layer, is formed of a transparent conductive material, for example, ITO or IZO. The second layer is formed to reduce an electrical resistance of the second electrode 227. Since the first electrode 220 is opaque and the second electrode is transparent, light emitted from the organic emitting layer 225 passes through the second electrode 227. As mentioned above, it may be called as a top emission type. The first electrode 220, the organic emitting layer 225 and the second electrode 227 constitute the organic electroluminescent diode E.

On the second substrate 202 facing the first substrate 201, red (R), green (G) and blue (B) color filter patterns 231a, 231b and 231c are formed to correspond to each pixel region P. A black matrix 233 corresponding to the column spacer 223 is formed at boundaries of each of the R, G and B color filter patterns 231a, 231b and 231c. The black matrix 233 has a single layer of a resin or double layers of chrome (Cr) and Cr complex (CrOx). As a result, the second electrode 227 on the column spacer 223 contacts the black matrix 233 such that a cell gap between the first and second substrates 201 and 202 is maintained. Alternatively, the black matrix can be omitted. In this case, the second electrode 227 on the column spacer 223 may contact the second substrate 201 or the R, G, and B color filter patterns 231a, 231b and 231c.

An adhesive layer 200 including a plurality of conductive balls 210 is formed between an inner space between the first and second substrates 201 and 202. Namely, the inner space between the first and second substrates 201 and 202 is filled with the adhesive layer 200. The penetration of contaminants, for example, moisture or gases, into the inner space between the first and second substrates 201 and 202 is prevented due to the adhesive layer 200.

The edges of the first and second substrates 201 and 202 are sealed by the seal pattern 260. However, since the seal pattern 260 is formed of polymer, moisture or gas is penetrated into the inner space between the first and second substrates 201 and 202 through the seal pattern 260 when the OELD is heated or used for long times. As mentioned above, the contaminants cause properties of the organic electroluminescent diode to be degraded or lifetime of the organic electroluminescent diode to be reduced. In addition, when an external force is applied on the OELD, there is a crack on the first and second electrodes of the organic electroluminescent diode or the driving TFT.

In the present invention, an inner space between the first and second substrates 201 and 202 is filled with the adhesive layer 200 such that the contaminants are blocked. Accordingly, the problems, for example, a degradation of properties of the organic electroluminescent diode, are prevented. In addition, even if an external force is applied on the OELD, there is no damage on the organic electroluminescent diode or the driving TFT due to the adhesive layer 200.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a first substrate including a plurality of pixel regions;
   a thin film transistor on the first substrate and in each pixel region;
   a second substrate facing the first substrate;
   an organic electroluminescent diode on the second substrate and connected to the thin film transistor, wherein the organic electroluminescent diode includes a first electrode on the second substrate, an organic emitting layer on the first electrode, and a second electrode on the organic emitting layer;
   a seal pattern at edges of the first and second substrates;
   an adhesive layer including a plurality of conductive balls, an inner space defined by the first substrate, the second substrate and the seal pattern filled with the adhesive layer;
   a connection electrode on the first substrate and electrically connected to the thin film transistor; and
   a connection pattern on the first electrode and under the organic emitting layer, wherein the second electrode over the connection pattern contacts the connection electrode.

2. The device according to claim 1, wherein the second electrode contacts the connection electrode such that the organic electroluminescent diode is connected to the thin film transistor.

3. The device according to claim 1, wherein the conductive balls are positioned between the connection electrode and the second electrode such that the connection electrode electrically connected to the second electrode through the conductive balls.

4. The device according to claim 1, wherein the first electrode is formed on an entire surface of the second substrate, and each of the organic emitting layer and the second electrode is separately formed in each pixel region.

5. The device according to claim 4, further comprising a partition of an insulating material having a reverse-trapezoid shape with respect to the second substrate and positioned between the first electrode and the organic emitting layer and at boundaries of the pixel region.

6. The device according to claim 4, further comprising a buffer pattern of an insulating material on the first electrode and under the organic emitting layer, wherein the buffer pattern is positioned at boundaries of the pixel region.

7. The device according to claim 1, wherein the first electrode is formed of a transparent material, and the second electrode is formed of an opaque material.

8. An organic electroluminescent device, comprising:
   a first substrate including a plurality of pixel regions;
   a thin film transistor on the first substrate and in each pixel region;
   a second substrate facing the first substrate;
   an organic electroluminescent diode on the second substrate and connected to the thin film transistor, wherein the organic electroluminescent diode includes a first electrode on the second substrate, an organic emitting layer on the first electrode, and a second electrode on the organic emitting layer;
   a seal pattern at edges of the first and second substrates;
   an adhesive layer including a plurality of conductive balls, an inner space defined by the first substrate, the second substrate and the seal pattern filled with the adhesive layer; and
   an auxiliary electrode between the second substrate and the first electrode, wherein the auxiliary electrode is positioned at boundaries of the pixel region.

9. A method of fabricating an organic electroluminescent diode, comprising:
   forming a thin film transistor on a first substrate including a plurality of pixel regions, the thin film transistor disposed in each pixel region;
   forming an electroluminescent diode on a second substrate facing the first substrate,
   wherein the step of forming the electroluminescent diode includes: forming a first electrode of a transparent conductive material on an entire surface of the second substrate; an organic emitting layer on the first electrode and in each pixel region; and a second electrode of an opaque metallic material on the organic emitting layer and in each pixel region;
   forming a seal pattern one of the first and second substrates;
   forming an adhesive layer including a plurality of conductive balls on the one of the first and second substrates;
   attaching the first and second substrates such that the thin film transistor connected to the organic electroluminescent diode;
   forming a connection electrode on the first substrate and electrically connected to the thin film transistor, the connection electrode contacting the second electrode; and
   forming a connection pattern on the first electrode before the step of forming the step of forming the organic emitting layer, wherein the second electrode over the connection pattern contacts the connection electrode,
   wherein an inner space defined by the first substrate, the second substrate and the seal pattern is filled with the adhesive layer.

10. The method according to claim 9, further comprising forming a connection electrode on the first substrate and electrically connected to the thin film transistor, wherein the conductive balls are positioned between the connection electrode and the second electrode such that the connection electrode electrically connected to the second electrode through the conductive balls.

11. The method according to claim 9, further comprising forming a buffer pattern of an insulating material on the first electrode before the step of forming the organic emitting layer, wherein the buffer pattern is positioned at boundaries of the pixel region.

12. A method of fabricating an organic electroluminescent diode, comprising:
   forming a thin film transistor on a first substrate including a plurality of pixel regions, the thin film transistor disposed in each pixel region;
   forming an organic electroluminescent diode on a second substrate facing the first substrate, including
      forming an auxiliary electrode on the second substrate, wherein the auxiliary electrode is positioned at boundaries of the pixel region; and
      after forming the auxiliary electrode, forming a first electrode of a transparent conductive material on an entire surface of the second substrate, an organic emitting layer on the first electrode and in each pixel region, and a second electrode of an opaque metallic material on the organic emitting layer and in each pixel region; and
   forming a seal pattern one of the first and second substrates;
   forming an adhesive layer including a plurality of conductive balls on the one of the first and second substrates; and
   attaching the first and second substrates such that the thin film transistor connected to the organic electroluminescent diode, wherein an inner space defined by the first substrate, the second substrate and the seal pattern is filled with the adhesive layer.

13. An organic electroluminescent device, comprising:
a first substrate including a plurality of pixel regions;
a thin film transistor on the first substrate and in each pixel region;
an organic electroluminescent diode on the first substrate and connected to the thin film transistor, the organic electroluminescent diode emitting a white light;
a second substrate facing the first substrate;
a color filter layer including red, green and blue color filter patterns on the second substrate;
a seal pattern at edges of the first and second substrates; and
an adhesive layer including a plurality of conductive balls, an inner space defined by the first substrate, the second substrate and the seal pattern filled with the adhesive layer.

14. A method of fabricating an organic electroluminescent diode, comprising:
forming a thin film transistor on a first substrate including a plurality of pixel regions, the thin film transistor disposed in each pixel region;
forming an organic electroluminescent diode on the first substrate and connected to the thin film transistor, the organic electroluminescent diode emitting a white light;
forming a color filter layer including red, green and blue color filter patterns;
forming a seal pattern one of the first and second substrates on the second substrate;
forming an adhesive layer including a plurality of conductive balls on the one of the first and second substrates; and
attaching the first and second substrates such that the thin film transistor connected to the organic electroluminescent diode,
wherein an inner space defined by the first substrate, the second substrate and the seal pattern is filled with the adhesive layer.

* * * * *